(12) United States Patent
Shin

(10) Patent No.: US 7,800,296 B2
(45) Date of Patent: Sep. 21, 2010

(54) ORGANIC LIGHT EMITTING DISPLAY DEVICE AND METHOD OF FABRICATING THE SAME

(75) Inventor: Hyun-Eok Shin, Suwon-si (KR)

(73) Assignee: Samsung Mobile Display Co., Ltd., Yongin-si (KR)

( * ) Notice: Subject to any disclaimer, the term of this patent is extended or adjusted under 35 U.S.C. 154(b) by 723 days.

(21) Appl. No.: 11/592,073

(22) Filed: Nov. 1, 2006

(65) Prior Publication Data

US 2007/0096614 A1 May 3, 2007

(30) Foreign Application Priority Data

Nov. 2, 2005 (KR) .................. 10-2005-0104508

(51) Int. Cl.
*H01J 1/62* (2006.01)
*H01J 63/04* (2006.01)
*H01J 9/00* (2006.01)

(52) U.S. Cl. ............. 313/504; 313/503; 313/506; 445/24

(58) Field of Classification Search ......... 313/504, 313/506, 510, 512, 503; 428/690, 817, 411.1; 257/72, 40, 500, 86; 315/169.3; 427/66; 445/24, 25; 345/36, 45, 76
See application file for complete search history.

(56) References Cited

U.S. PATENT DOCUMENTS

| | | | | |
|---|---|---|---|---|
| 6,828,205 | B2 * | 12/2004 | Tsai et al. | 438/313 |
| 7,453,198 | B2 * | 11/2008 | Kang et al. | 313/498 |
| 7,486,016 | B2 * | 2/2009 | Lee | 313/506 |
| 7,524,226 | B2 * | 4/2009 | Winters | 445/3 |
| 2003/0181042 | A1 * | 9/2003 | Chen et al. | 438/689 |
| 2004/0124766 | A1 * | 7/2004 | Nakagawa et al. | 313/504 |
| 2004/0245917 | A1 * | 12/2004 | Lu et al. | 313/503 |
| 2005/0006648 | A1 * | 1/2005 | Yamazaki et al. | 257/72 |
| 2005/0236629 | A1 * | 10/2005 | Lee et al. | 257/79 |
| 2006/0197086 | A1 * | 9/2006 | Rhee et al. | 257/59 |
| 2006/0251924 | A1 * | 11/2006 | Lu et al. | 428/690 |

* cited by examiner

*Primary Examiner*—Peter J Macchiarolo
*Assistant Examiner*—Glenn Zimmerman
(74) *Attorney, Agent, or Firm*—Christie, Parker & Hale, LLP

(57) ABSTRACT

An organic light emitting display device including a first electrode that has a three layer structure, improved adhesion, and is simple to fabricate, and a method of fabricating the same, are provided. The organic light emitting display device includes: a substrate; a first electrode disposed on the substrate, the first electrode comprising a first metal layer including Mo or an Mo alloy, a second metal layer disposed on the first metal layer and including Ag or an Ag alloy, and a third metal layer disposed on the second metal layer and including a transparent conductive oxide layer; an organic layer disposed on the first electrode and including an organic emission layer; and a second electrode disposed on the organic layer.

18 Claims, 5 Drawing Sheets

(a)

(b)

ORGANIC LIGHT EMITTING DISPLAY DEVICE AND METHOD OF FABRICATING THE SAME

CROSS-REFERENCE TO RELATED APPLICATION

This application claims priority to and the benefit of Korean Patent Application No. 10-2005-0104508, filed Nov. 2, 2005 in the Korean Intellectual Property Office, the entire content of which is incorporated herein by reference.

BACKGROUND OF THE INVENTION

1. Field of the Invention

The present invention relates to an organic light emitting display device and a method of fabricating the same, and more particularly, to an organic light emitting display device that includes a first electrode having a first metal layer, a second metal layer, and a third metal layer including a transparent conductive oxide layer, and a method of fabricating the same.

2. Description of the Related Art

In general, an organic light emitting display device includes a first electrode, an organic layer disposed on the first electrode and having an organic emission layer, and a second electrode disposed on the organic layer. In the organic light emitting display device, when a voltage is applied between the first and second electrodes, holes are injected from the first electrode into the organic layer, and electrons are injected from the second electrode into the organic layer. The holes and electrons injected into the organic layer are recombined in the organic emission layer and form excitons. When the excitons transition from an excited state to a ground state, light is emitted.

In such an organic light emitting display device, the first electrode is a reflection type, i.e., is formed to reflect light, and the second electrode is a transmission type, i.e., is formed to transmit light. Thus, a top-emission organic light emitting display device that emits light from the organic emission layer toward the second electrode may be fabricated.

Compared to widely commercialized liquid crystal displays (LCDs), the organic light emitting display device, an active emissive display device, has advantages of wide viewing angle, high picture quality, and motion picture display capability due to a 30,000 times fast response speed. The organic light emitting display device has a stacked structure having enhanced luminous efficiency due to increased recombination of electrons and holes.

In the organic light emitting display devices, while a conductive material having an excellent reflection property and an appropriate work function is suitable for the reflection-type first electrode, it appears that no single applicable material has both of these properties. Accordingly, the reflection-type first electrode may be formed in a multi-layer structure.

FIG. 1 is a schematic cross-sectional view illustrating a method of fabricating a conventional organic light emitting display device including a reflection-type first electrode.

Referring to FIG. 1, a substrate 100 on which a reflective layer 110a and a transparent conductive layer 110b are sequentially stacked is provided. A thin film transistor and a capacitor may be included between the substrate 100 and the reflective layer 110a.

Here, the reflective layer 110a may include aluminum (Al) which has an excellent reflection property, and the transparent conductive layer 110b may be formed of indium tin oxide (ITO) or indium zinc oxide (IZO) which has a high work function.

Subsequently, a photoresist pattern is formed on the transparent conductive layer 110b, and the transparent conductive layer 110b and the reflective layer 110a are sequentially etched using the photoresist pattern as a mask. After etching, the photoresist pattern is removed using a stripping solution so as to complete a first electrode 110 including the reflective layer 110a and the transparent conductive layer Then, an organic layer 120 including an organic emission layer is formed on the first electrode 110, and a second electrode 130 is formed on the organic layer, thereby completing an organic light emitting display device.

However, Al and ITO, which are used respectively for a reflective layer and a transparent conductive layer in a first electrode of a conventional organic light emitting display device, are impossible or extremely difficult to blanket-etch due to a galvanic effect, and thus a fabrication process of the organic light emitting display device is complicated. Also, since silver (Ag), which can be blanket-etched along with ITO and has an excellent reflection property, does not adhere well to a planarization layer, a very gentle cleaning process is performed and many particles remain, which is a leading cause of dark pixel defects.

SUMMARY OF THE INVENTION

The present invention, in one embodiment, provides an organic light emitting display device and a method of fabricating the same, in which a first electrode has improved reflectivity and adhesion to a planarization layer due to a modified composition and structure, and has a simple fabrication process.

According to one aspect of the present invention, an organic light emitting display device includes: a substrate; a first electrode disposed on the substrate, the first electrode including a first metal layer including molybdenum (Mo) or an Mo alloy, a second metal layer disposed on the first metal layer and including silver (Ag) or an Ag alloy, and a third metal layer disposed on the second metal layer and including a transparent conductive oxide layer; an organic layer disposed on the first electrode and including an organic emission layer; and a second electrode disposed on the organic layer.

According to another aspect of the present invention, a method of fabricating an organic light emitting display device includes: forming a first electrode on a substrate, the first electrode including a first metal layer including Mo or an Mo alloy, a second metal layer including Ag or an Ag alloy, and a third metal layer including a transparent conductive oxide layer; forming an organic layer including an organic emission layer on the first electrode; and forming a second electrode on the organic layer.

BRIEF DESCRIPTION OF THE DRAWINGS

The above and other features of the present invention will be described in reference to certain exemplary embodiments thereof with reference to the attached drawings in which.

DETAILED DESCRIPTION

Figure 1:
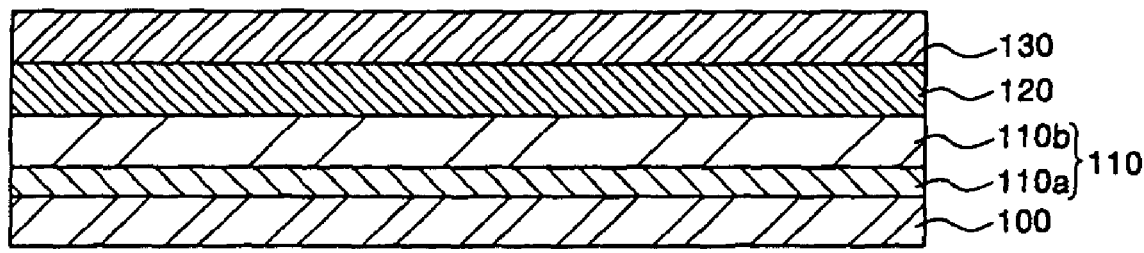
FIG. 1 is a schematic cross-sectional view illustrating a method of fabricating a conventional organic light emitting display device including a reflection-type first electrode.

The present invention will now be described more fully hereinafter with reference to the accompanying drawings, in which exemplary embodiments of the present invention are shown. In the drawings, the thicknesses of layers and regions are exaggerated for clarity. The same reference numerals are used to denote the same elements throughout the specification.

Figure 2:
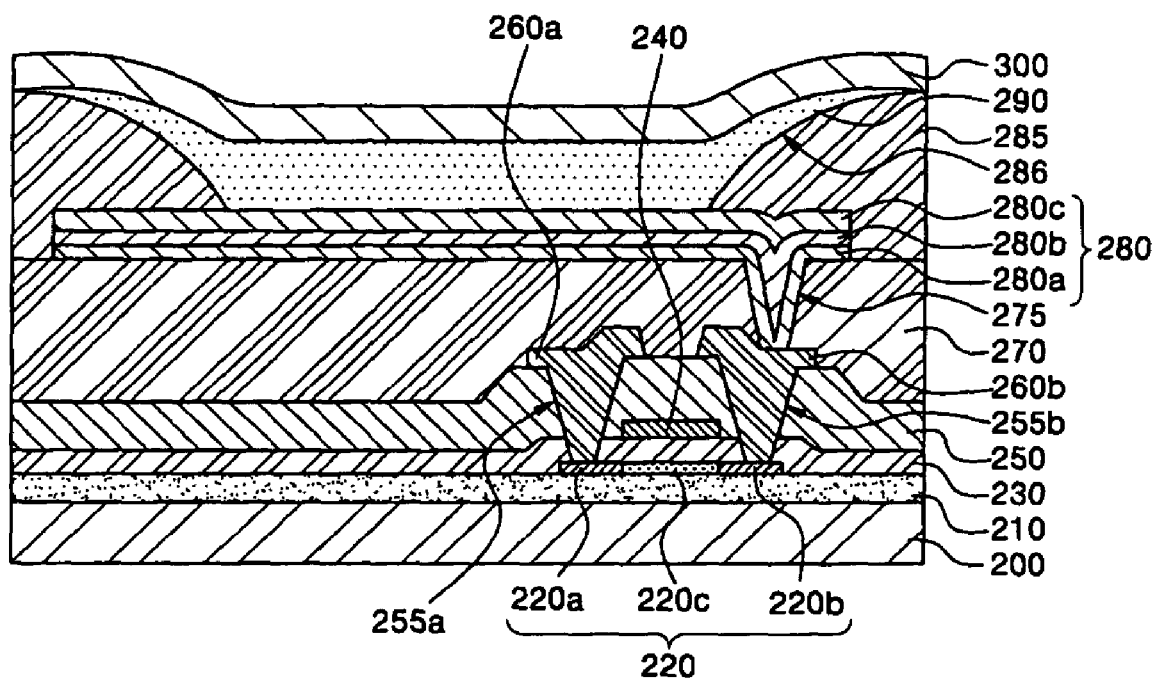
FIG. 2 is a cross-sectional view illustrating an organic light emitting display device according to an exemplary embodiment of the present invention.

FIG. 2 is a cross-sectional view illustrating an organic light emitting display device (which may also be referred as an organic light emitting diode (OLED) display) according to an exemplary embodiment of the present invention.

Referring to FIG. 2, a buffer layer 210 is formed on a substrate 200 formed of glass or plastic. A semiconductor layer 220 having source and drain regions 220a and 220b and a channel region 220c is formed on the buffer layer 210.

Here, the buffer layer 210 may be a silicon oxide layer, a silicon nitride layer, a silicon oxynitride layer or a multi-layer thereof. Also, the semiconductor layer 220 may be formed of polycrystalline silicon or single crystal silicon crystallized from amorphous silicon.

A gate insulating layer 230 is formed on substantially the entire surface of the substrate having the semiconductor layer 220. A gate electrode 240 is formed at a certain region corresponding to the semiconductor layer 220 on the gate insulating layer 230.

The gate insulating layer 230 may be a silicon oxide layer, a silicon nitride layer, a silicon oxynitride layer, or a multi-layer thereof. The gate electrode 240 may be formed of one selected from the group consisting of aluminum (Al), an Al alloy, Molybdenum (Mo), and an Mo alloy. In one embodiment, the gate electrode 240 is formed of a molybdenum-tungsten (MoW) alloy.

Then, an interlayer insulating layer 250 is formed on substantially the entire surface of the substrate having the gate electrode 240. The interlayer insulating layer 250 may be a silicon nitride layer or a silicon oxide layer.

The interlayer insulating layer 250 and the gate insulating layer 230 are etched so as to form contact holes 255a and 255b exposing portions of the source and drain regions 220a and 220b.

Then, source and drain electrodes 260a and 260b electrically connected to the source and drain regions 220a and 220b through the contact holes 255a and 255b are formed. The source and drain electrodes 260a and 260b are formed of a low-resistance material to reduce interconnection resistance, for example, Mo, W, titanium (Ti) or Al.

A planarization layer 270 is formed on substantially the entire surface of the substrate including the source and drain electrodes 260a and 260b. The planarization layer 270 may be formed of polyimide, benzocyclobutene series resin or acrylate.

Subsequently, the planarization layer 270 is etched, thereby forming a via hole 275 exposing a portion of the drain electrode 260b. First metal layer, second metal layer and third metal layer 280a, 280b and 280c are sequentially stacked to be electrically connected to the drain electrode 260b through the via hole 275.

Here, the first metal layer 280a includes Mo or an Mo alloy with excellent adhesion to the planarization layer 270, and the Mo ally may be an MoW alloy. In one embodiment, the tungsten content of the MoW alloy may be 10 to 35%. The first metal layer 280a may be formed by sputtering. Also, the thickness of the first metal layer 280a may be 5 Å to 200 Å (0.0005 μm to 0.02 μm). In one embodiment, when the thickness is less than 5 Å, the first metal layer cannot be evenly formed on the planarization layer 270, and when the thickness is more than 200 Å, its adhesion to the planarization layer 270 decreases due to the stress of Mo itself.

Additionally, the second metal layer 280b includes Ag or an Ag alloy with excellent reflectivity, and the Ag alloy may include one or more of samarium (Sm), copper (Cu), terbium (Tb), molybdenum (Mo) and tungsten (W). The second metal layer 280b may be formed by sputtering. Also, the thickness of the second metal layer 280b may be 900 Å to 2000 Å (0.09 μm to 0.2 μm). In one embodiment, when the thickness is less than 900 Å, the second metal layer partially transmits light so that it cannot effectively work as a reflective layer, and when the thickness is more than 2000 Å, fabrication cost and process time increase, which is not preferable.

Also, the third metal layer 280c may be a transparent conductive oxide layer having a low work function, and the transparent conductive oxide layer may be formed of ITO or IZO. The thickness of the third metal layer 280c may be 50 Å to 100 Å (0.005 μm to 0.01 μm). In one embodiment, when the thickness is less than 50 Å, the third layer 280c cannot be evenly formed on the second metal layer 280b, and when the thickness is more than 100 Å, an interference effect occurs, lowering reflectivity by at least 10-15% especially in a blue region, and the color of the transparent conductive oxide layer itself is expressed.

Next, a photoresist pattern is formed on the third metal layer 280c, and the first to third metal layers 280a to 280c are blanket-etched by wet-etching using an etchant including at least one of nitric acid, phosphoric acid or acetic acid, using the photoresist pattern as a mask, to form a first electrode 280 made of a sequential stack of the first to third metal layers 280a to 280c. Then, the photoresist pattern is removed using a stripping solution.

Thus, the first electrode 280 including the first to third metal layers 280a to 280c is completed.

A pixel defining layer 285 is formed on the first electrode 280 and patterned, thereby forming an opening 286. The pixel defining layer 285 may be formed of one selected from the group consisting of polyimide, benzocyclobutene series resin and acrylate.

Then, an organic layer 290 including an organic emission layer is formed in a region where the first electrode 280 is exposed and on the pixel defining layer 285. The organic layer 290 may include one or a multi-layer of a hole injection layer, a hole transport layer, a hole blocking layer, an electron transport layer and an electron injection layer, in addition to the organic emission layer.

A second electrode 300 is formed on substantially the entire surface of the substrate including the organic layer 290. The second electrode 300 may be formed of one metal selected from the group consisting of Mg, Ag, Al, Ca and an alloy thereof. In other embodiments, the second electrode 300 may be formed of a transparent material such as ITO or IZO.

Thus, an organic light emitting display device formed in a triple structure including the first electrode 280, the organic layer 290 and the second electrode 300 is completed.

Figure 3:
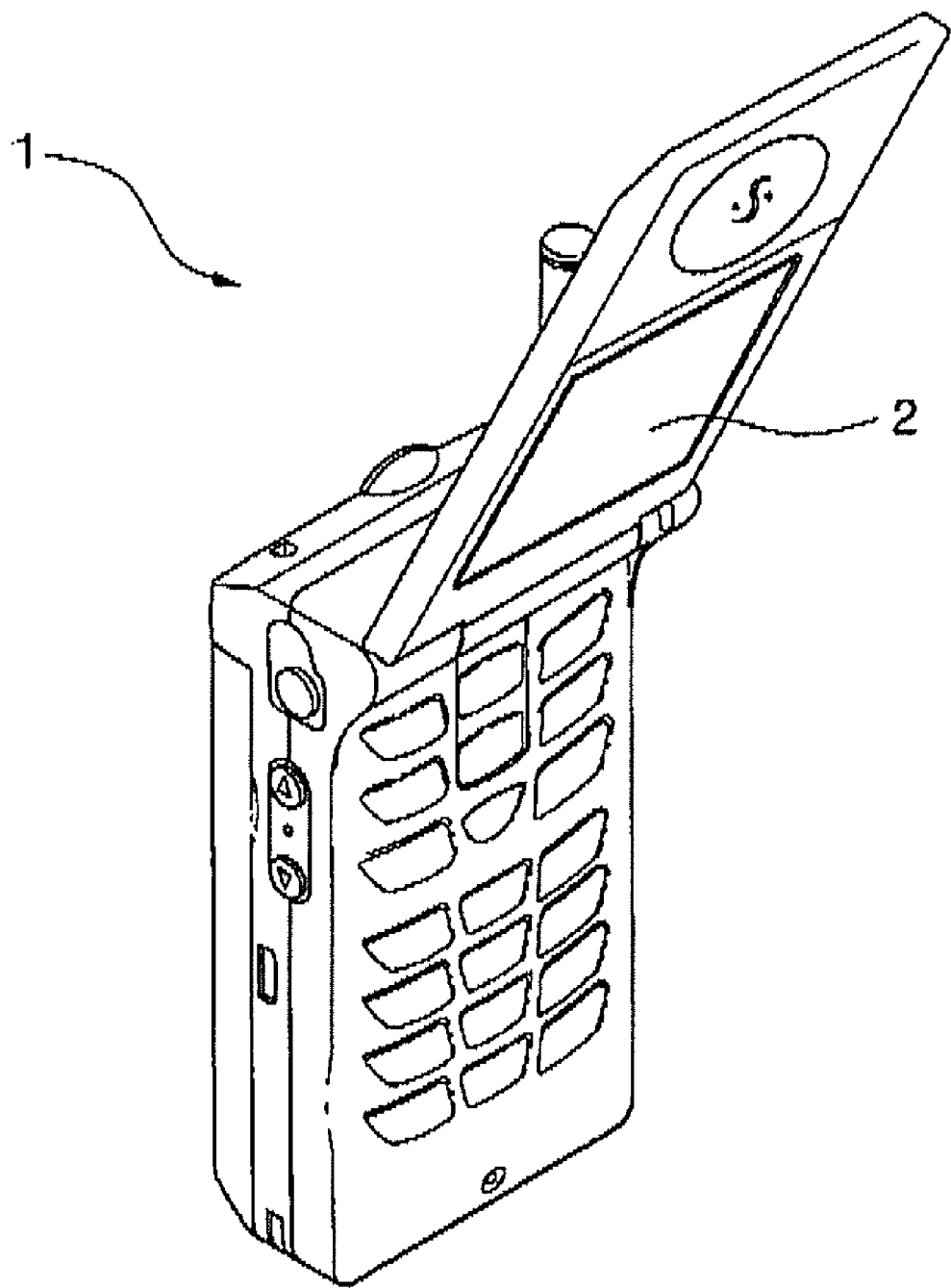
FIG. 3 is a portable terminal which is an electronic device using an organic light emitting display device according to an exemplary embodiment of the present invention.

FIG. 3 illustrates a portable terminal 1 which is an electronic device using an organic light emitting display device according to an exemplary embodiment of the present invention.

Referring to FIG. 3, the portable terminal 1 includes an organic light emitting display device 2. The portable terminal 1 also includes a body containing electronics, on which the organic light emitting display device 2 is mounted. As described above, the organic light emitting display device 2, in one embodiment, is formed of a first electrode made of a sequential stack of Mo or an Mo alloy, and Ag or an Ag alloy, and ITO, an organic layer including an organic emission layer, and a second electrode, stacked on a substrate in sequence. A thin film transistor, a capacitor, a planarization layer, etc., are disposed between the substrate and the first electrode. Here, the Mo or the Mo-alloy can drastically decrease dark pixel defects by improving adhesion to the planarization layer. Also, resistance of the first electrode and its contact resistance to source and drain electrodes are reduced, thereby reducing the driving voltage. A portable terminal including such an organic light emitting display device has improved display quality. Accordingly, the quality of the product is improved.

While the above exemplary embodiment refers to a portable terminal as an example of an electronic device, the organic light emitting display device is not limited thereto and can be utilized in various electronic devices.

The present invention will now be described with reference to more specific exemplary embodiments, which are not intended to limit the scope of the invention.

EXEMPLARY EMBODIMENT 1

An Mo layer was formed to a thickness of 200 Å (0.02 μm) on a substrate, an ATD layer, which is an Ag alloy layer formed of ATD available from Hitachi, was formed to a thickness of 1000 Å (0.1 μm) on the Mo layer, and an ITO layer was formed to a thickness of 70 Å (0.007 μm) on the ATD layer. Subsequently, a photoresist pattern was formed on the ITO layer, and the Mo layer, the ATD layer and the ITO layer were wet-etched using the photoresist pattern as a mask so as to form a reflection-type first electrode having a triple structure.

EXEMPLARY EMBODIMENT 2

An MoW alloy layer was formed to a thickness of 200 Å (0.02 μm) on a substrate, an ATD layer, which is an Ag alloy layer formed of ATD available from Hitachi, was formed to a thickness of 1000 Å (0.1 μm) on the MoW alloy layer, and an ITO layer was formed to a thickness of 70 Å (0.007 μm) on the ATD layer. Subsequently, a photoresist pattern was formed on the ITO layer, and the MoW alloy, the ATD layer and the ITO layer were wet-etched using the photoresist pattern as a mask so as to form a reflection-type first electrode having a triple structure.

COMPARATIVE EXEMPLARY EMBODIMENT 1

An ITO layer was formed to a thickness of 200 Å (0.02 μm) on a substrate, an Ag layer was formed to a thickness of 1000 Å (0.1 μm) on the ITO layer, and an ITO layer was formed to a thickness of 70 Å (0.007 μm) on the Ag layer. This is the conventional structure of a first electrode.

Table 1 shows a comparison of resistivity between an organic light emitting display device including the first electrode of Comparative Exemplary Embodiment 1 and an organic light emitting display device including the first electrode of Exemplary Embodiment 1.

TABLE 1

|  | Lower ITO layer of Comparative Exemplary Embodiment 1 | Lower Mo layer of Exemplary Embodiment 1 |
| --- | --- | --- |
| Resistivity | 160-180 μΩ·cm | 14-15 μΩ·cm |

Referring to Table 1, in Comparative Exemplary Embodiment 1, the resistivity of the lower ITO layer constituting the first electrode is about 160 to 180 μΩ·cm, and in Exemplary Embodiment 1, the resistivity of the lower Mo layer constituting the first electrode is about 14 to 15 μΩ·cm. Accordingly, the resistivity of the Mo layer in Exemplary Embodiment 1 is significantly lower than that of the lower ITO layer in Comparative Exemplary Embodiment 1.

COMPARATIVE EXEMPLARY EMBODIMENT 2

An ITO layer was formed to a thickness of 200 Å (0.02 μm) on a substrate having a thin film transistor, an Ag layer was formed to a thickness of 1000 Å (0.1 μm) on the ITO layer, and an ITO layer was formed to a thickness of 70 Å (0.007 μm) on the Ag layer. This is the conventional structure of a first electrode.

Table 2 shows the comparison of contact resistance between the first electrode of Comparative Exemplary Embodiment 2 and a drain electrode (Ti/Al/Ti) of a thin film transistor, and between the first electrode in Exemplary Embodiment 1 and a drain electrode (Ti/Al/Ti) of a thin film transistor.

TABLE 2

|  | Comparative Exemplary Embodiment 2 | Exemplary Embodiment 1 |
| --- | --- | --- |
| Contact resistance | 170 Ω | 5.5 Ω |

Referring to Table 2, contact resistance between the first electrode and the drain electrode is 170 Ω in Comparative Exemplary Embodiment 2 and 5.5 Ω in Exemplary Embodiment 1. Accordingly, contact resistance in Exemplary Embodiment 1 is significantly lower than that in Comparative Exemplary Embodiment 2.

Figure 4A:
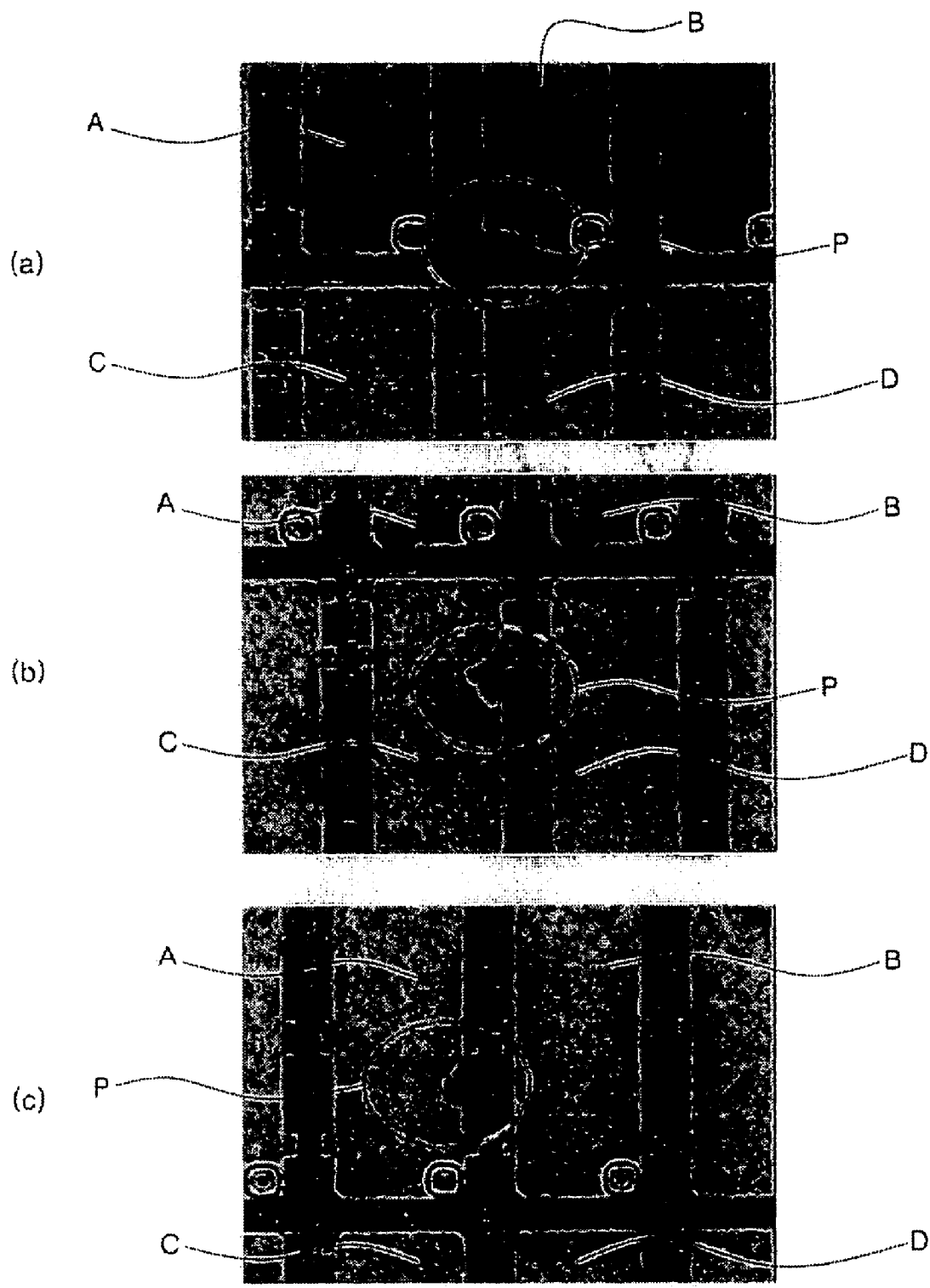
FIG. 4A illustrates photographs of a peeling off phenomenon occurring between a first electrode and a substrate in Comparative Exemplary Embodiment 1.
Figure 4B:
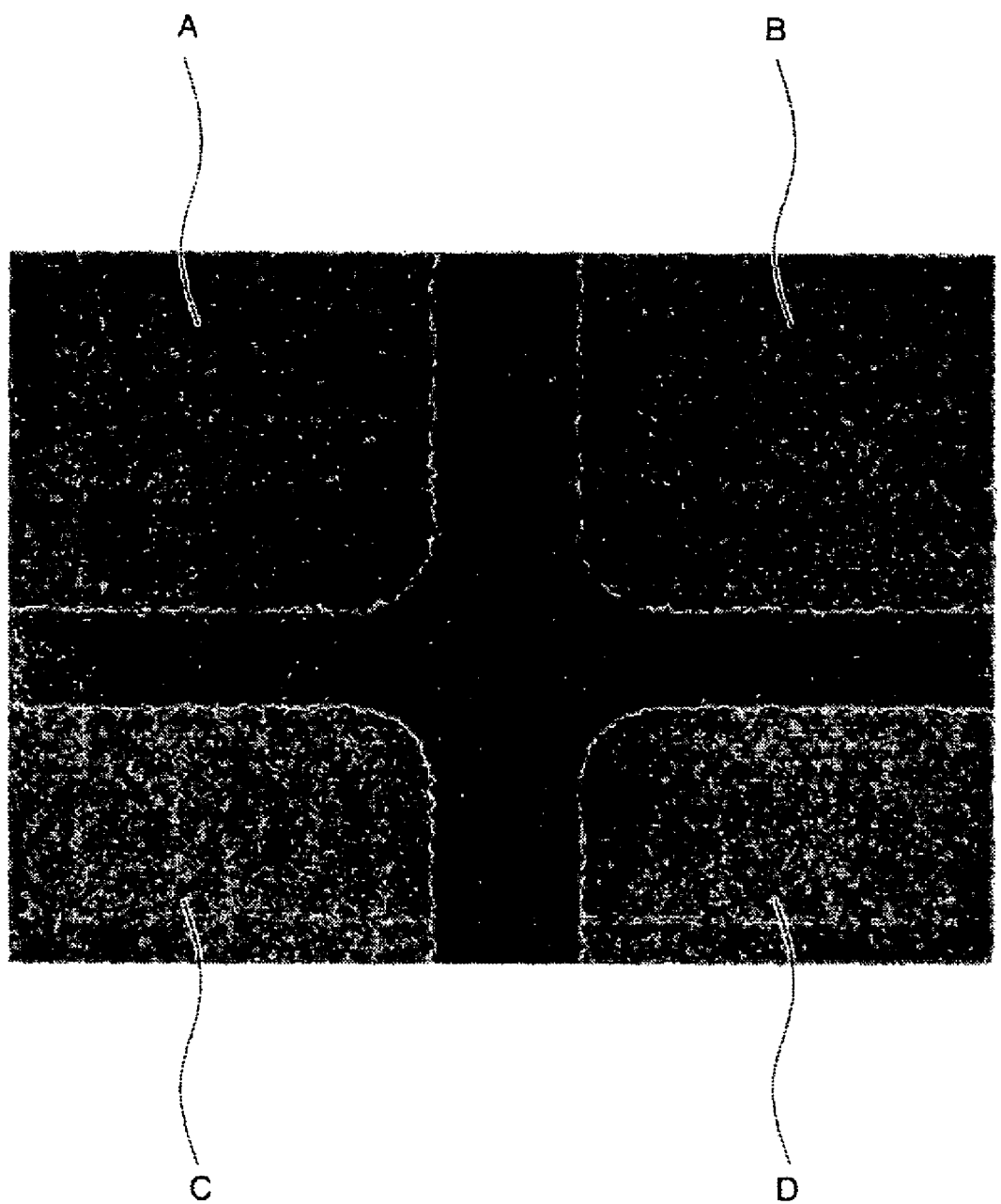
FIG. 4B illustrates a photograph of adhesion of a first electrode to a substrate according to Exemplary Embodiment 1.

FIG. 4A illustrates photographs of a first electrode adhering to a substrate when the first electrode of Comparative Exemplary Embodiment 1 is wet-etched, and FIG. 4B shows a photograph of a first electrode adhering to a substrate when the first electrode of Exemplary Embodiment 1 is wet-etched.

Referring to FIGS. 4A and 4B, A, B, C and D shown in the photographs (a), (b) and (c) of FIG. 4A indicate unit pixels, respectively. It can be seen in the photograph (a) of FIG. 4A that a peeling off phenomenon occurs due to deterioration of adhesion between a first electrode and a substrate, i.e., between an ITO layer and a planarization layer, at unit pixel B. Also, it can be noted that the peeling off phenomenon occurs at unit pixel C in the photograph (b) of FIG. 4A, and additionally at unit pixel A in the photograph (c) of FIG. 4A. In FIG. 4B, the peeling off phenomenon does not occur, so it can be seen that adhesion between the substrate and the first electrode of Exemplary Embodiment 1, i.e., between an Mo layer and a planarization layer, is excellent. In FIGS. 4A and 4B, corresponding components are denoted by like reference symbols.

Figure 5:
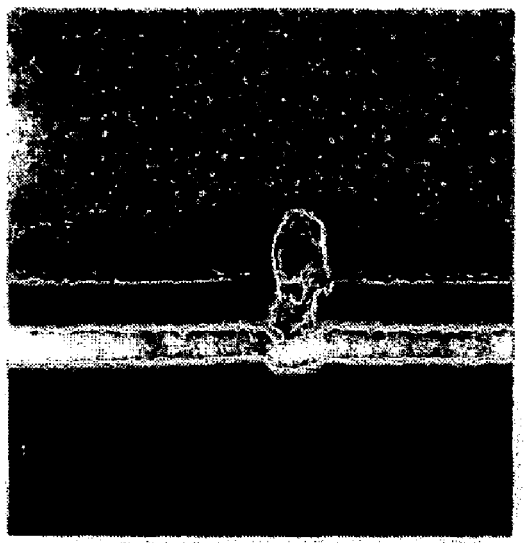
FIG. 5 illustrates photographs of dark pixel defects caused by particles of an organic light emitting display device in Comparative Exemplary Embodiment 1.
Figure 5:

FIG. 5 illustrates photographs (a) and (b) of dark pixel defects caused by particles of an organic light emitting display device including a first electrode of Comparative Exemplary Embodiment 1. Since the first electrode of Comparative Exemplary Embodiment 1 exhibits poor adhesion to a substrate, a very gentle cleaning process is performed. In such instance, particles are not completely removed, which is the main cause of dark pixel defects. On the other hand, the first electrode of Exemplary Embodiment 1 exhibits good adhesion to a substrate, so that a strong cleaning process can be performed. Thus, as particles are completely removed, little or no dark pixel defects occur.

An organic light emitting display device according to an exemplary embodiment of the present invention exhibits improved adhesion to a planarization layer, which minimizes or reduces defects such as dark pixels generated by particles, and reduces resistance to source and drain electrodes compared to a conventional organic light emitting display device, which minimizes or reduces driving voltage. Also, a first electrode having a triple structure is blanket-etched, thereby shortening process time and simplifying a fabrication process.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting display device, comprising:
   a substrate;
   a first electrode disposed on the substrate, the first electrode comprising a first metal layer including molybdenum (Mo) or an Mo alloy, a second metal layer disposed on the first metal layer and including silver (Ag) or an Ag alloy, and a third layer disposed on the second metal layer and including a transparent conductive oxide layer;
   an organic layer disposed on the first electrode and including an organic emission layer; and
   a second electrode disposed on the organic layer,
   wherein the second metal layer is thicker than the first metal layer and the third layer.

2. The organic light emitting display device according to claim 1, wherein the first metal layer has a thickness of 50 Å to 200 Å.

3. The organic light emitting display device according to claim 1, wherein the Mo alloy is a molybdenum tungsten (MoW) alloy.

4. The organic light emitting display device according to claim 2, wherein the second metal layer has a thickness of 900 Å to 2000 Å.

5. The organic light emitting display device according to claim 1, wherein the Ag alloy comprises at least one of samarium (Sm), copper (Cu), terbium (Tb), Mo or tungsten (W).

6. The organic light emitting display device according to claim 1, wherein the third layer has a thickness of 50 Å to 100 Å.

7. The organic light emitting display device according to claim 1, wherein the transparent conductive oxide layer comprises indium tin oxide (ITO) or indium zinc oxide (IZO).

8. An electronic device comprising a body containing electronics; and
   the organic light emitting display device according to claim 1 mounted on the body.

9. A method of fabricating an organic light emitting display device, comprising:
   forming a first electrode on a substrate, the first electrode comprising a first metal layer including molybdenum (Mo) or an Mo alloy, a second metal layer including silver (Ag) or an Ag alloy, and a third layer including a transparent conductive oxide layer;
   forming an organic layer including an organic emission layer on the first electrode; and
   forming a second electrode on the organic layer,
   wherein the second metal layer is thicker than the first metal layer and the third layer.

10. The method according to claim 9, wherein forming the first electrode further comprises blanket-etching the first electrode using wet-etching.

11. The method according to claim 10, wherein the wet-etching uses an etchant including phosphoric acid, acetic acid or nitric acid.

12. The method according to claim 9, wherein the first metal layer is formed to a thickness of 50 Å to 200 Å.

13. The method according to claim 9, wherein the Mo alloy is a molybdenum tungsten (MoW) alloy.

14. The method according to claim 9, wherein the second metal layer is formed to a thickness of 900 Å to 2000 Å.

15. The method according to claim 9, wherein the Ag alloy comprises at least one of samarium (Sm), copper (Cu), terbium (Tb), Mo or tungsten (W).

16. The method according to claim 9, wherein the third layer is formed to a thickness of 50 Å to 100 Å.

17. The method according to claim 9, wherein the transparent conductive oxide layer comprises indium tin oxide (ITO) or indium zinc oxide (IZO).

18. The method according to claim 9, further comprising preparing the substrate.

* * * * *